United States Patent [19]

Zucker

[11] Patent Number: 5,185,586
[45] Date of Patent: Feb. 9, 1993

[54] METHOD AND APPARATUS FOR DIGITAL SYNTHESIS OF MICROWAVES

[75] Inventor: Oved S. F. Zucker, Del Mar, Calif.

[73] Assignee: Energy Compression Research Corp., San Diego, Calif.

[21] Appl. No.: 695,383

[22] Filed: May 3, 1991

Related U.S. Application Data

[63] Continuation-in-part of Ser. No. 855,454, Apr. 24, 1986.

[51] Int. Cl.$^5$ .............................................. H03K 3/42
[52] U.S. Cl. .................................... 331/96; 331/172; 331/173; 307/106
[58] Field of Search ............... 331/96, 99, 107 P, 172, 331/173; 307/106, 108, 117, 311; 328/63; 333/13, 20

[56] References Cited

U.S. PATENT DOCUMENTS

| | | | |
|---|---|---|---|
| 3,484,619 | 12/1969 | Proud | 250/211 J |
| 3,917,943 | 11/1975 | Autson | 250/211 J |
| 4,176,295 | 11/1979 | Driver et al. | 315/39 |
| 4,218,618 | 8/1980 | Mourou | 250/211 J |
| 4,329,686 | 5/1982 | Mourou | 342/202 |
| 4,438,331 | 3/1984 | Davis | 250/211 J |
| 4,667,161 | 5/1987 | Wilcox | 307/268 X |
| 4,782,222 | 11/1988 | Ragle et al. | 250/211 J |
| 4,864,119 | 9/1989 | Ragle et al. | 250/211 R |
| 4,891,815 | 1/1990 | Ragle et al. | 372/44 |

OTHER PUBLICATIONS

"A Kilovolt Picosecond Optoelectronic Switch and Pockel's Cell", LeFur et al., Appl. Phys. Lett., vol. 28, No. 1, Jan. 1976.
"Megawatt Nanosecond Switching of High-Power Laser Activated on Switches," Zucker, Long & Smith, 12 Modular Symposium, Feb. 1976.
"Experimental Demonstration of High-Power, Fast-Rise-Time Switching In Silicon Junction Semiconductors", Apply. Phys. Lett. 29 (4, 15), Aug. 1976.
"Light Activated Semiconductor Switches", Preprint UCRL-80046, O. S. F. Zucker, Oct. 1977.
"High Frequency Waveform Generation Using Optoelectronic Switching in Silicon", Proud et al., IEEE Transactions on Microwave Theory Techniques, vol. MTT-26, No. 3, Mar. 1978.
"High-Power Switching With Picosecond Precision", Mourou et al., Appl. Phys. Lett. 35(7), Oct. 1979.
"Optically Controllable Millimeter Wave Phase Shifter", DeFonzo et al., Appl. Phys. Lett 38(6), Oct. 1979.
"Picosecond Microwave Pulse Generator", Mourou et al., Appl. Phys. Lett. 38(6), Mar. 1981.
"Picosecond High-Power Switching and Applications", Mourou et al., Laser Focus, Apr. 1982.
"Advances in Picosecond Optoelectronics", Mourou et al., SPIE vol. 322 Picosecond Lasers and Applications, 1982.
"Optical Control of Semiconductor Closing and Opening Switches," IEEE Transactions on Electron Devices, vol. 37, No 12.
"High-Powered Microwave Generation Using Optically Activated Semiconductor Switches," Nunnally, IEEE Transactions on Electron Devices, vol. 37, No. 12.
"Photoconductive Semiconductor Switch Experiments for Pulsed Power Applications," Zutavern et al., IEEE Transactions on Electron Devices, vol. 37, No. 12.
"35 -kV GaAs Subnanosecond Photoconductive Switches," Pocha et al., IEEE Transactions on Electron Devices, vol. 37, No. 12.
"Photoconductive Nanosecond Pulse Generation Utilizing Radial Transmission Lines," Kim et al., IEEE Transactions on Electron Devices, vol. 37, No. 12.

Primary Examiner—David Mis
Attorney, Agent, or Firm—Marks & Murase

[57] ABSTRACT

A source for generating energy in the microwave region to a load comprising a transmission line, a semiconductor switch connected between said transmission and said load, said switch being operable, in its open state, to sustain a voltage corresponding to the average maximum electric field physically sustainable by the switch and, in its closed state, to sustain the maximum current density J equal to $Wd_3$, where W is the width of the switch and $d_3$ its thickness to thereby supply maximum power to the load and maximum switching speed.

39 Claims, 3 Drawing Sheets

METHOD AND APPARATUS FOR DIGITAL SYNTHESIS OF MICROWAVES

BACKGROUND OF THE INVENTION

This application is a continuation-in-part of copending U.S. Application Ser. No. 855,454 filed Apr. 24, 1986.

FIELD OF THE INVENTION

The present invention relates to a method and apparatus for generating microwaves and more particularly to a microwave source and a method for generating microwaves by digital synthesis.

BACKGROUND OF THE INVENTION

While the present invention has broad application in many fields, such as communications and power transmission, pulsed power and electro-optics, it is especially suitable for use in the generation of an extremely high power microwave pulse(s) (a burst of microwave energy), preferably in the form of several cycles of a periodic sine or square wave, in the GHz regime. While the examples discussed below refer to microwave generation, this does not imply any restriction as to the applications to which the present invention may be put.

The general concept of producing microwaves by a sequential operation of switches is well known. High peak power microwave generation is addressed by Driver et al. in U.S. Pat. No. 4,176,295 in which the generation of microwaves by periodically discharging a plurality of identical, direct current energized, resonant transmission lines into a TE wave guide at half-multiple wavelength spacings is discussed. To periodically discharge the transmission lines, each is provided with a light activated solid state (LASS) diode switch, the LASS diode switches being simultaneously operated by laser beams of equal optical path length to cause the electromagnetic energy in the waveguide to propagate as a pulse train of microwave energy Mourou, in U.S. Pat. No. 4,329,686 discusses an arrangement, similar to that of Driver et al., which uses a TE waveguide and a LASS switch for generating microwave pulses of picosecond duration, synchronously and in response to laser light pulses.

Unfortunately, the arrangements described by Driver et al. and Mourou do not produce clean microwave pulses and are limited in power since TE waveguides have impedances close to that of free space, typically 50 ohms or more, and therefore cause the LASS switches to operate outside the electric field and current density limits consistent with good high power design principles, specifically, unidirectional power flow in a continuously matched system.

In "Experimental demonstration of high power, fast rise-time switching in silicon junction semiconductors" Applied Physics Letters, Volume 29, page 261, Zucker, Long, Smith, Page and Hower discuss the use of a light-activated semiconductor switch, the basic principle of which is to create carriers in situ, thus obviating the need for diffusing the carriers necessary to transition a transistor or thyristor switch from a reversed biased (OFF) condition to a forward biased (ON) condition. In a later publication, "Light Activated Semiconductor Switches," UCRL Preprint, Oct. 1977 Zucker and Long discuss the use of a laser beam whose frequency is matched to the switching device bandgap (1.12eV for silicon) to turn ON a LASS switch in less than 1 ps. As discussed in the article, a switch having sub-nanosecond turn on time, and capable of fast turn off after current ceases to flow, would be required for microwave generation in order to allow for quick recharge and refire and for the establishment of coherence among independent microwave sources.

Such a switch is addressed by Proud et al. in their article "High Frequency Waveform Generation Using Optoelectronic Switching in Silicon" IEEE Trans on Microwave Theory and Techniques, Vol. MTT-26, No. 3 (1978), in which the conversion of dc energy into RF pulses by using an array of silicon switches simultaneously activated by a laser pulse is discussed. Proud et al. envision a frozen wave generator comprising array of high-resistivity silicon switches fired by a gas laser designed to simultaneously fire all of the switches in exact synchronism.

Mourou et al. in their article entitled "Picosecond Microwave Pulse Generation", Applied Physics Letters 38(6) (1981) discuss the generation of a microwave burst in picosecond synchronization with an optical pulse using a LASS switch coupled to an x-band waveguide and describe the efforts of others to generate microwave pulses using electrically driven spark gaps and frozen wave pulses using LASS switching.

The LASS switch can take on several forms, depending on such factors as the level of doping within the semiconductor, the profile of the doping, the amount of optical energy supplied to the device in order to turn on and the direction at which the optical energy is introduced to the switch with respect to the electric field within the switch.

D. H. Auston, in "Picosecond optoelectronic switching and gating in silicon", Applied Physics Letters, Volume 26, page 101 (1975), illuminated a gap in a microstrip transmission line, which was laid down on a silicon substrate, by a laser pulse with wavelength $\lambda = 0.53$ $\mu$m. This created a thin layer of electrical carriers in the upper portion of the substrate within the gap, thus allowing current to flow along the microstrip line. Current through the line was later stopped by illuminating the gap with a laser pulse of wavelength $\lambda = 1.06$ $\mu$m which created a region of carriers which extended throughout the height of the silicon substrate, effectively shorting the upper conductor to the lower (ground) conductor. The voltage switched was 35 V into 50 $\Omega$ in a time of 15 ps, thus acting as a fast switch for low power pulses. This structure is the subject of U.S. Pat. No. 3,917,943.

LeFur and Auston, in their article "A Kilovolt Picosecond Optoelectronic Switch and Pockel's Cell" Applied Physics Letters, Volume 28, No. 1 (1976) pages 21–23, which discuss a silicon switch which is turned on by absorption of a 5 psec optical pulse from a mode locked Nd:glass laser. LeFur and Auston contemplate the combination of a silicon switch and Pockel's cell in order to efficiently switch large optical signals by small optical signals at high speed. The voltage applied across the gap was increased to 1.5 kV and was applied in a pulsed mode, rather than d.c. as in the earlier switch. An estimated 45 kW of electrical power was switched using this technique (1.5 KV into 50 $\Omega$).

G. Mourou, in U.S. Pat. No. 4,347,437, describes a semiconductor switch which employs avalanche breakdown. In this design of a LASS switch, the high voltage held across the switch is less than the voltage required to cause avalanche breakdown. Avalanche occurs when the energy of a carrier accelerated by the electric field is such that impact ionization occurs on collision with an atom in the semiconductor lattice. A small concentration of carriers is generated uniformly throughout the semiconductor by an optical pulse, thus triggering the avalanche process. The device has to be kept at cryogenic temperatures to reduce the possibility of a thermally generated carrier initiating the avalanche process. Mourou claims that a laser diode pulse of 3 nJ can produce 1 MW of power using this method.

S. J. Davis, in U.S. Pat. No. 4,438,331, describes a semiconductor switch, fabricated from intrinsic semiconducting material, with some light, uniform doping to trap thermally generated carriers, which holds off up to 10 kV over a microstrip gap of 1-3 mm. The size of the switch is not given, except for the fact that the switch itself is rectangular in shape, with a length which is at least twice that of the microstrip gap. The switch is activated by a diode laser with an optical pulse length of the order of 500 ps. It was claimed that such a device could switch 2 MW (10 kV into 50Ω) in sub-nanosecond time scales, with an optical pulse in the energy range of 10-100 nJ.

In a subsequent patent, U.S. Pat. No. 4,864,119, L. O. Ragle and S. J. Davis describe the use of partial light penetration in a LASS to cause field enhancement and subsequent avalanche. The preferred embodiment of this patent included a LASS in which the activating optical pulse was introduced into the semiconducting material in a direction parallel to the electric field (e.g., through a hole in an electrode). The electric field held across the device is between one tenth and one third that field needed to induce avalanche. The wavelength of the light and the band-gap of the semiconductor were chosen such that the optical pulse was substantially absorbed before reaching the second electrode. This creates a volume of material which has low resistance due to photoconduction and so the voltage of the first electrode is transferred to the surface of the conducting region. The field held across that part of the switch which is still insulating is therefore enhanced to a point where avalanche breakdown occurs and a current "breaks through" to the second electrode, thus closing the switch. Since a significant fraction of the switch volume requires to be photoconducting, the optical requirements of this type of switch are significantly higher than for the Mourou-type switch. It is claimed that a voltage of 5 kV can be switched by an optical input in the range of 20-200 nJ.

L. O. Ragle, S. J. Davis and R. A. Williams, in U.S. Pat. No. 4,864,119, subsequently described a switch of the field enhancement/avalanche design using a mesa structure for the top electrode in order to improve the voltage hold off capabilities.

The virtues of LASS switches over other high power switches such as the spark gap and SCR has long been recognized. The spark gap has a high power handling and a fast current rise time capability relative to the SCR but is slower than a LASS switch and is short lived. The conventional semiconductor switch has the ability to handle moderately high powers and is long lived but is relatively slow since it relies on charge carriers diffusing laterally into a junction for switching. By means of optical carrier generation, LASS switches in essence provide a switching action such as that found in thyristors or other junction devices with a current rise time capability in the nanosecond to picosecond range and thus combine the junction device high power handling capability and long life with fast rise time.

There are many different designs for photoconductive switches, as illustrated by the discussion above. However, these designs make little or no attempt to increase the power handling capability. There is an unfulfilled need for a LASS design which optimizes the power which can be transferred by the switch. The basic difference between the present invention and prior art is that the present invention takes into account the dimensional and impedance relationships which allows for maximum power generation. This is the impedance relation.

Moreover, while various schemes for generating microwaves using LASS switches (a.k.a. photoconductive solid state or "PCSS" switches) are known, no truly effective digitally synthesized microwave sources are presently available. In addition, there exists a need for a microwave source which can project significant amounts of microwave energy at a predetermined point in space, a need which requires a plurality of individual sources timed to be coherent with one another, a need not satisfied by prior art devices. There also exists an unfulfilled need for a microwave source which can produce either continuous microwave energy or short bursts of microwave energy of high magnitude. Further, no available high power microwave sources have sufficient intersource coherence to generate phase coherent microwave pulses from a phased array of microwave sources.

SUMMARY OF THE INVENTION

It is therefore an object of the present invention to provide a method and apparatus for generating high power microwave pulses.

It is a further object of the invention to provide a method and apparatus for digitally synthesizing microwaves.

It is yet a further object of the present invention to provide a method and apparatus for microwave generation in the TEM mode by providing for unidirectional power flow in a continuously matched system.

It is a further object of the invention to provide a means for establishing maximum power transmission by LASS switches through consideration of the geometry of the switch and transmission line.

It is a further object of the invention to provide a single junction or multiple junction semiconductor switching device for generating an energy pulse(s).

It is yet a further objective of the invention to provide a switch and transmission line structure of general application, e.g., a Pockel cell.

Additional objects, advantages and novel features of the invention will be set forth in the description which follows and in part will become apparent to those skilled in the art upon examination of the following or may be learned by practice of the invention.

In accordance with the invention there is provided a method and apparatus for providing a high power, phase coherent microwave source using LASS technology. The choice among the various LASS microwave generation sources may be tailored according to the needs of a particular application.

The present invention contemplates four aspects, each of which can be used alone or in conjunction with other:

(1) Sequential switching of one or more (cascaded) TEM transmission lines of arbitrary length(s), each transmission line being charged to an arbitrary voltage; where two or more transmission lines are used, the delay between any two switching events is equal or greater than the temporal length of the transmission line separating them with the first switch activated being the one closest to the load.

(2) The use of an optimized transmission line and switch geometry to yield the highest possible power flow.

(3) A "folded" microwave source configuration to provide added compactness and/or simplified energizing of the transmission lines.

(4) The use of reverse biased light activated solid state diodes as switches to provide for extremely rapid switch recovery upon recharging of the transmission lines after discharge, the recharging operating to forcefully reverse bias the diodes.

For microwave pulses having a wavelength of a $\eta$s or less, a single junction LASS device may be used. For longer wavelength pulses, a transistor type (i.e., a two-junction) LASS will more advantageously be used. For very long wavelength pulses an SCR type (i.e., a three-junction) LASS device will more advantageously be used.

It will be understood by the artisan that a single junction or double junction LASS switch will open when back biased. The SCR type (i.e., three-junction) LASS device will not.

BRIEF DESCRIPTION OF THE DRAWINGS

The accompanying drawings, which are incorporated in and form a part of the specification, illustrate various presently preferred embodiments of the invention, and, together with the description, serve to explain the principles of the invention. In the drawings.

DETAILED DESCRIPTION OF THE INVENTION

Reference will now be made in detail to the presently preferred embodiments of the invention, examples of which are illustrated in the accompanying drawings.

As alluded to above, various schemes for producing microwaves by switching various constant voltage and uniform geometry sources are known in the art. In accordance with the present invention, it is now possible to achieve high power operation with great waveform flexibility using LASS switches to sequentially switch cascaded transmission lines operated at low impedance, e.g., 1 ohm or less, to take advantage of the high current density limit of LASS switches. One aspect of the present invention involves providing a microwave source having LASS switches where the switch configuration falls within certain dimensional parameters for maximizing the power flow through the source. In order to obtain optimal output power commensurate with electric field limitations, current density limitations, wavelength and related dimensions in the entire system (transmission lines, semiconductor switch, etc.) a configuration that provides continuously matched, uninterrupted power flow with the Poynting vector at the maximum possible field limit (E and H) is required. In general the power flow in a wave guide or transmission line is given by the expressions:

$$P = V^2/Z_o, \text{ or} \qquad 1(a)$$

$$P = E \times H \qquad 1(b)$$

where V is the wave voltage, $Z_o$ is the wave guide or transmission line impedance, and P is the Poynting vector.

V is fixed by the electric field limit of the switch, by the microwave wavelength and by the transmission line and switch lengths which, as explained in detail below, are required to be smaller than the microwave wavelength. Since V is fixed, P can be increased only by reducing $Z_o$.

Unfortunately, by their very nature TE and TM waveguides, such as those used in some of the prior art, have impedances close to that of free space, typically 50 ohms or more. On the other hand, in the TEM mode transmission line spacing can be much smaller than the microwave wavelength, thus, impedances of a fraction of an ohm are allowed and can therefore be employed. As developed in detail below, the optimum impedance level is that which permits operation at both the electric field and current density limits commensurate with sound design and suppression of parasitics.

Microwave Generation

As alluded to above, the present invention contemplates microwave generation in the TEM mode, which not only permits high power operation, but also provides for unidirectional power flow in a continuously matched system obtained through sequential switching. The present invention also contemplates various switching schemes for modulation purposes and various geometrical configurations which provide maximum power flow and which simplify electrical charging of the transmission line, resulting in great compactness. The preferred embodiment of a basic microwave generator according to present invention is illustrated in FIG. 1A.

Figure 1A:
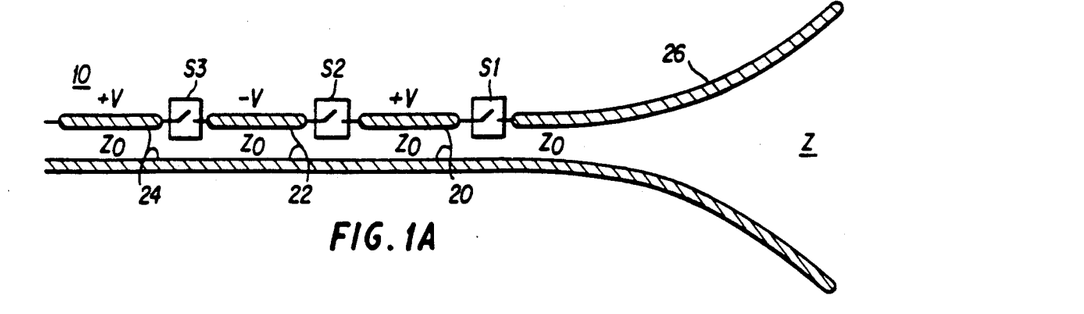
FIG. 1A is a schematic representation of a microwave source with LASS switches depicted as idealized mechanical switches.

The microwave source 10 illustrated in FIG. 1A comprises a series of matched transmission line pairs 20, 22, 24 of impedance $Z_o$, connected in cascade by switches $S_1$, $S_2$, $S_3$ shown schematically as ideal switches. In the embodiment illustrated in FIG. 1A, the transmission line pairs 20, 22 and 24 each have a length $1 \leq \lambda 4$, and are alternately charged to $+V$ and $-V$. As will become apparent from the discussion below, transmission line segments of length other than $\lambda/4$ can also be advantageously employed and the transmission line segments can be charged to any arbitrary voltage. The first (and in some cases only) transmission line 20 is connected to a transformer such as exponential or adiabatic horn 26 which starts at impedance Zo and slowly opens out to reach an impedance Z which couples efficiently with that of free space or of a waveguide. The transformer or horn 26 may advantageously be wholly or partially filled with dielectric material having a dielectric constant which may be either a constant or varying magnitude in order to match an arbitrary load. The purpose of the horn 26 is to match the low TEM transmission line impedance to the high antenna impedance or conventional TE or TM waveguide impedance.

Figure 1B:
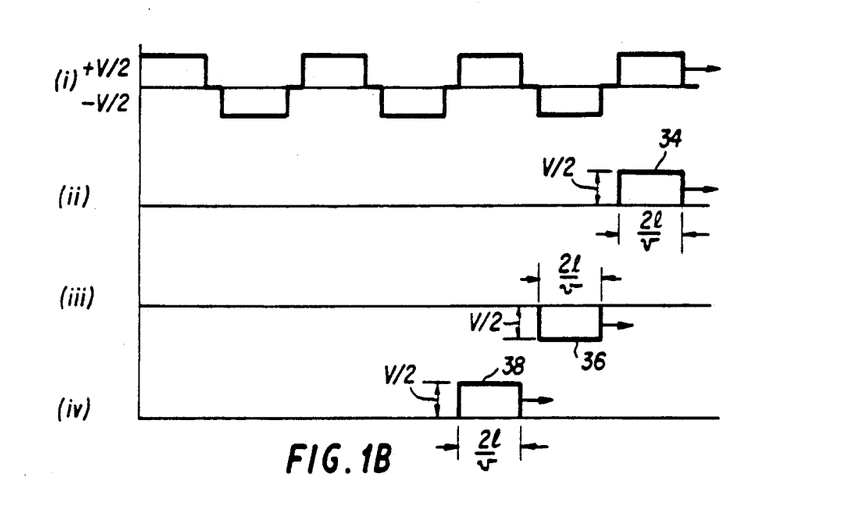
FIG. 1B is a graphical depiction of a microwave pulse generated using the source of FIG. 1A illustrating one possible timing sequence.

To generate microwaves, switch S1 is first closed. As illustrated in FIG. 1B this produces a pulse 34 of height V/2 and duration 2l/v, where v is the speed of the propagating pulse in the transmission line and 1 is the length of one segment of the transmission line, traveling into the matched horn 26. In this case the pulse duration, 2l/v is less than or equal to one half the microwave period to be generated. Since switch S2 is open, this transmission line is discharged completely. The pulse travelling into the horn 26 rises in voltage to maintain its power, $V^2/Z$, constant. Thus, for example, as the wave transforms from 1 ohm to 100 ohms, the wave voltage rises from 1.0V to 10.0V. The maintenance of uniform microwave power flow (backward moving waves still constitute forward moving power flow) is one of the elements providing for extremely high power and power density capability.

Switch S2 in FIG. 1A can be closed any time after the voltage at the "left" end of the first transmission line 20 reaches zero. This means that the time between switching is greater than or equal to 2l/v. When switch S2 is closed, a negative pulse, 36, of amplitude $-V/2$ is launched to the right as viewed in FIG. 1A. The pulse 36 encounters the matched first line 20 terminated by the matched horn 26. Thus, the process operates entirely in the matched condition regardless of delay time variation which is of course also the maximum power condition. Similarly, after the transmission line 22 has been discharged, switch S3 may be closed, producing the discharge pulse 38 at the transmission line 22 having magnitude $+V/2$ and duration $2l_{24}/v$ (where $l_{24}$ is the length of transmission line segment 24), which also moves to the right as viewed in FIG. 1B.

The combination of these pulses and an additional succeeding pulses is shown in FIG. 1B(i).

This sequencing method, in contrast to the frozen wave approach of Proud, provides for waves which travel the shortest possible distance to the antenna thus reducing attenuation and dispersion and allowing for a significantly increased number of cascaded lines (and thus in the number of pulses or cycles which can be generated from a single source) as well as a reduction in the total charge from a single source transferred by each switch which in turn reduces total switch losses.

More significantly, and in contrast to the frozen wave approach, the present invention permits instantaneous variation in frequency (and phase) for the purpose of wide band modulation by allowing for transmission line segments of variable length, the discharge of each transmission line being controlled by an independently operated switch.

Figure 1C:
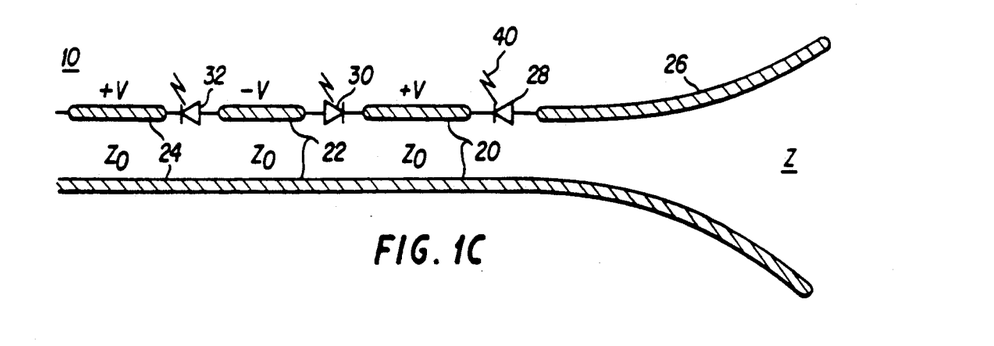
FIG. 1C is a schematic representation of a microwave source with LASS switches depicted as reversed biased diodes.

Referring now to FIG. 1C there is depicted a microwave source in which switches 28, 30, 32, which correspond to switches S1, S2 and S3 respectively of FIG. 1A, are represented as LASS diodes positioned so that each is reverse biased by the alternating charge voltages on transmission line pairs 20, 22 and 24. In that condition, the diodes 28, 30 and 32 are reverse biased. "Closing" of a diode switch, in the sense of turning the diode on, is performed by the selective impaction of optical pulses, having a wavelength closely matched to the bandgap of the LASS material (approximately 1.1 eV in silicon) and indicated in FIG. 1C by flashes 40, into the individual LASS diode. The photons thus impacted produce carriers (electrons and holes) thereby rendering the diode conducting.

Upon the discharge of a transmission line pair, an intrinsic or amorphous semiconductor switch will normally remain conductive for the duration of the carrier lifetime. Since the carrier lifetime duration in silicon is approximately 100 microseconds, practically no carriers are lost in the nanosecond or picosecond range of interest for producing microwaves. Further, in some of the prior art LASS switches discussed above intrinsic or amorphous semiconductor materials are used which make it difficult to recharge the transmission lines for rapid refiring, necessitating use of short carrier lifetime materials such as Ga-As, an immature technology relative to silicon. In addition, a short carrier lifetime requires more laser light energy to maintain carrier density. One aspect of the present invention is that the recharging of a transmission line pair for a repeat discharge operates to reverse bias the LASS diode switch, thereby forcefully draining the charge from the semiconductor material resulting in the "opening" of the diode switch. This process can be achieved in times significantly less than the carrier lifetimes and provides for a high repetition rate capability. As a result, the time between repeated firing of the source 10 may be made equal to or less than the microwave burst time.

Some of the factors pertinent to the selection of intrinsic semiconductor material or junction devices for microwave generation are as follows. Junction devices are voltage limited to about 15 kV across their reversed biased junction but intrinsic devices hold a voltage proportional to their length (E must be less than 100kV/cm). However, as discovered by applicant, for microwave generation the practical length of a switch has to be small relative to the microwave wavelength to minimize reflection losses. Moreover, junction devices can be connected in series if voltage drops in excess of 15 kV are required. In intrinsic devices, the "open" state has to be rather short (10 ns) due to the low "open" resistance (typically $10^4$ ohm-cm) to prevent discharge of current and/or damage to the semiconductor. On the other hand, reverse biased junctions exhibit resistivities up about $10^{10}$ ohm-cm. In addition, for high current densities, conductor bonding to semiconductors have to be controlled, both metallurgically and for doping.

Thus, the preference of junction devices over intrinsic material for microwave generation arises from their desirable high repetition rate capability, and their "high" open impedance. Further, even though the required switch length, dictated by the wavelength considerations discussed below (switch length equal to about 1 to 5 mm), limits the maximum voltage to less than 15 kV (which is the maximum attainable by most available junction devices), for higher voltages, multi-junction diode devices may be used as switches, the junctions being in series with the matched transmission lines so as to be able to support a higher voltage drop. Moreover, with either junction devices or intrinsic materials, transmission line contact to the semiconductor switch requires doping which is easily accomplished employing mature junction device technology.

Design Constraints

Figure 2:
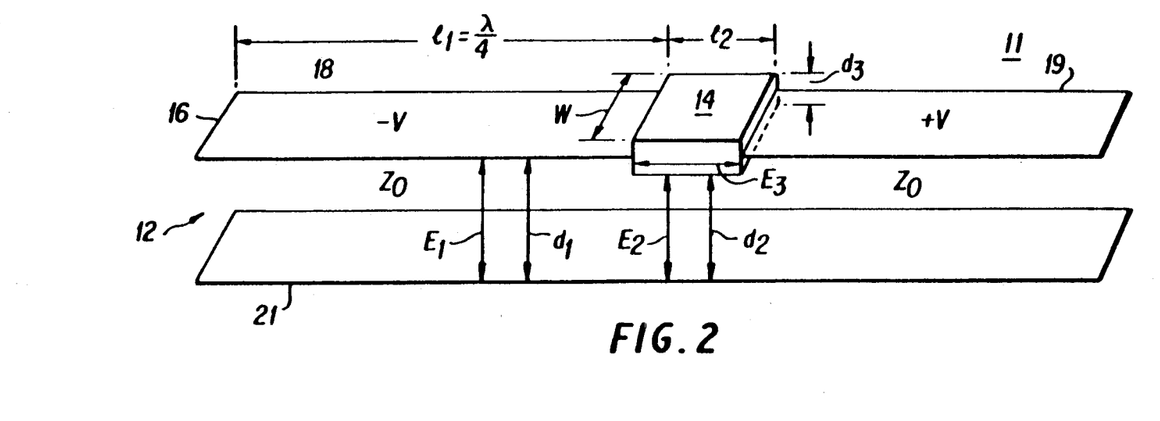
FIG. 2 is a schematic representation of two TEM transmission lines linked by a LASS switch.

An analysis of the fundamental constraints in designing a microwave generator for digitally synthesizing microwaves will now be discussed in connection with FIG. 2. As will be apparent from the analysis, the fundamental constraints limiting power are the switch and transmission line geometry as well as the maximum electric field and maximum current density sustainable by the switch. In FIG. 2 the numeral 11 generally depicts a TEM transmission line pair 12 having a LASS or PCSS switch 14 inserted in a line 16 of the transmission line pair 12. A portion 18 of the line 16 is charged to $-V$ and a portion 19 of the line 16 is charged to $+V$. If only a single segment transmission line is used, the switch 14 would be connected in series with a load.

In FIG. 2, $E_1$ represents the electric field between the transmission line pairs 18 and 21, and 19 and 21; $E_2$ represents the electric field between the LASS switch 14 and the line 21; and $E_3$ represents the electric field in the LASS switch 14. Further, $d_1$ represents the distance between the lines 18 and 21 and the lines 19 and 21, while $d_2$ the distance between the LASS switch 14 and the line 21. Further, $l_2$, $d_3$ and w represent the length, thickness and width, respectively, of the LASS switch 14, while $l_1$ represents the length of the transmission line segment 18. Preferably, the thickness of the switch $d_3$ is approximately equal to the penetration depth of the laser light used to activate the switch.

As will be understood by the artisan, the transmission line has a wave impedance of $d_1 \sqrt{\mu/\epsilon}$ where $\mu$ is a permeability constant of the space between the lines or conductors forming the transmission line and $\epsilon$ is the dielectric constant of the space between the lines or conductors. Preferably, $d_1$ is in the range of about 0.001 in. to 0.100 in..

The maximum electric field in a p-n junction is inversely proportional to $\log_{10}(N_B)$ where $N_B$ is the background doping. Thus the maximum electric field is limited by the material purity. Assuming the LASS switch 14 is made of silicon having an $N_B$ on the order of about $10^{12}$ cm$^{-3}$ (a purity level commercially available), the maximum electric field in the switch, $E_3$, should be no greater than on the order of 200 kv/cm. Further, in order for the transmission line 11, considered as whole, to closely approximate a TEM transmission line, the length of the switch $l_2$, must generally be much less than the length of the transmission line segments $l_1$. As will be appreciated by the artisan the length ratio between the transmission line segment 18 and the switch 14, represented by the ratio $l_2/l_1$, and the relationship between the spacings $d_1$ and the thickness $d_3$ all affect impedance matching and hence reflection losses within the source. It should further be appreciated that the example of impedance matching discussed below is exemplary only and that acceptable impedance matching commensurate with maximum power flow can be achieved if the following relationships are maintained. The ratio $l_2/l_1$ should be between 0.01 and 0.50 consistent with the geometry of the transmission line. The ratio $d_2/d_3$ should be within the range of about 0.1 to 1.0, the ratio $d_1/d_3$ should be in the range of about 0.01 to 100, and the ratio $d_3/d_1-d_2$ should be within the range of about 1.0 to 10.0. Preferably, the product of $l_1 \times d_1$ is more than ten times the product of $l_2'd_3$. As should be apparent, the various ratios defined above are presented as ranges since a change in any one of the ratios affects the others. For example, the larger the ratio $l_1/l_2$, the smaller the ratios $d_2/d_3$ and $d_3/d_1-d_2$ in order to maintain acceptable impedance matching. As will be apparent to the artisan after review of this specification, a similar relationship can be developed for other types of transmission lines, e.g., coaxial, radial, folded, wire pair, a flat conductor and a wire, etc., and all are within the spirit and scope of the present invention.

Returning to the example of FIG. 2, the discharge of a transmission line segment preferably produces a pulse having a duration of half the microwave oscillation period desired, in double the transit time. Thus $l_1=\lambda/4$. To avoid a mismatch between the transmission line section and the switch section, the switch length must be small compared to the transmission line length. Calculations have shown that consistent with the switch geometry limits discussed above, with $l_1$ about equal to 10 $l_2$, reflections are kept to an acceptable level. Since in the embodiment of FIG. 2, the electric field $E_3$ in the LASS switch 14 is $2V/l_2$, the maximum voltage on the charged transmission line should be:

$$V = \frac{\lambda E_3 \eta_1}{8\sqrt{\epsilon}} \tag{2}$$

where $\eta_1 = l_1/l_2 = 0.1$ and $\epsilon$ is the dielectric constant of the material filling the transmission line spacing.

From equation (2), it is seen that the maximum voltage on the transmission line is fixed by the sustainable switch electric field $E_3$, the microwave wavelength, $\lambda$, the dielectric constant, $\epsilon$, and the dimensionless ratio, $\eta$. As alluded to above, one aspect of the invention is to permit operation at the maximum current and current density while minimizing reflections due to mismatches between transmission line sections and switch sections. To derive a general solution to maximize power flow, we first consider the Poynting power density and then consider the power density in the transmission line.

Since the Poynting power density is $E_1 \times H$ ($E_3$ being fixed), in order to maximize the Poynting power density one must maximize H. Since H is inversely proportional to the line impedance, it is desirable to decrease the impedance in order to increase H. The impedance of the transmission line can be expressed as:

$$Z_o = \frac{d_1}{w} Z \tag{3}$$

where $$Z = \sqrt{\frac{\mu}{\epsilon}}.$$

H can thus be written as:

$$H = \frac{I}{w} \cdot \frac{V}{d_1 Z} \tag{4}$$

where $I = V/Z_o$. From equation (4), it is easily seen that H increases with decreasing $d_1$ (decreasing impedance). Since the power density in the switch ($P = E_3 \times J$) can only be maximized by operating at $J_{max}$, the maximum current density sustainable by the switch, H can be expressed as:

$$H = J_{max} d_3 \quad (5)$$

Thus two conditions exist for increasing H; decreasing $d_1$ (hence the impedance) and increasing $d_3$ However, the process of decreasing $d_1$ and increasing $d_3$ cannot be extrapolated indefinitely since as $d_3$ approaches $d_1$, it has now been found that the mismatch in the transmission line becomes excessive leading to multiple reflections. Under the geometrical constraint that $d_1 = d_2 + d_3/2$, calculations have shown that with $d_3$ less than or equal to $d_2/3$, reflections are kept to an acceptable level. Thus the conditions of maximizing $d_3$ and minimizing reflection leads to $d_3 = d_2/3$ (or $d_3 = 2d_1/7$).

Within the dimensional constraint for maximizing the current, the maximum power density in the transmission line is achievable only by maximizing the current density. Since the propagating voltage pulse in the transmission line is V/2, the current density can be expressed as:

$$J = \left(\frac{V/2}{Z_o}\right)\left(\frac{1}{d_3 w}\right) \quad (6)$$

Substituting equation (2) for the voltage yields:

$$J = \frac{\lambda E_3 \eta_1}{16 \, Z \, d_1 d_3 \sqrt{\epsilon}} \quad (7)$$

Having established the relationship between $d_1$, $d_2$, and $d_3$ from maximum Poynting power condition, the dimension $d_2$ which results in operation at the maximum current density is:

$$d_2 = \left[\frac{\lambda E_3 \eta_1}{8 \, J_{max} \, Z \sqrt{\epsilon} \, (2\eta_2 + \eta_2^2)}\right]^{\frac{1}{2}} \quad (8)$$

where $\eta_2 = d_3/d_2$

Considering the preferred ratios of $l_2/l_1$, $d_2/d_3$ and $d_3/d_1 - d_2$ discussed above, it can be stated that in general $d_1$ and $d_2$ are related as follows:

$$d_1, d_2 \propto \left[\frac{\lambda E_3 \eta_1}{8 \, J_{max} \, Z \sqrt{\epsilon} \, (A\eta_2 + \eta_2^2)}\right]^{\frac{1}{2}} \quad (8A)$$

where A = scalar in the range of from about 1.0 to 10.0.

The above relationship was calculated on the basis that the effective current carrying width of the switch W is generally the same as the current carrying width, $W_1$, of the conductors (which, in FIG. 2, are linear, parallel conductors which carry an essentially constant current density). Since the impedance of both the transmission line and switch is inversely proportional to width, in the case where $W = W_1$, the width term drops out of the calculation for maximum current density. In practice, it is preferable that the width (W) of the switch be from about 0.5 to 2.0 times the width ($W_1$) of the conductors. If the switch 13 is too narrow, its dimension will control the maximum current density. If it is too large, it is a waste of space and will prevent ideal impedance matching.

The maximum power density in the transmission line can be expressed as:

$$P_{max} = \frac{I_{max}(V/2)}{d_2 w} \quad (9)$$

Substituting I = $Jd_3 w$ and equation (2) yields:

$$P_{max} = \frac{\lambda E_3 J_{max} \eta_1 \eta_2}{16 \sqrt{\epsilon}} \quad (10)$$

The power flowing in the transmission line is simply:

$$P_{source} = \frac{\lambda E_3 J_{max} \eta_1 \eta_2}{16 \sqrt{\epsilon}} \times d_2 w \quad (11)$$

Note that the power level can be chosen by scaling the width of the line ($d_2$ being fixed by maximum current density condition).

We now consider the optical to microwave energy gain. Considering each transmission line as an elemental microwave source; it is possible to calculate the gain of an elemental source relative to the optical input energy, $W_{ph}$, used to operate the LASS switch. The optical input energy (photon energy) may be expressed as follows:

$$W_{ph} = \frac{d_3 w V_{ph} J}{Y \epsilon_f} \quad (12)$$

where n is the carrier density, e is the electronic charge, $V_{ph}$ is the bandgap energy (eV), Y is the avalanche gain and $\epsilon_f$ is the light coupling efficiency.

Substituting the expression $J = neV_d$, where $V_d$ is the carrier drift velocity, into equation (12) yields $$W_{ph} = \frac{d_3 w V_{ph} J}{Y \epsilon_f V_d} \times \frac{\lambda \eta_1}{4} \quad (13)$$

The microwave energy $W_{\mu w}$, corresponding to one switch operation in one transmission line section can be determined from the following relationship:

$$W_{\mu w} = I\left(\frac{V}{2}\right)\left(\frac{T}{2}\right) \quad (14)$$

Substituting the expression for voltage and T = Mc into equation (14) yields:

$$W_{\mu w} = (Jd_3 w)\left(\frac{\lambda E_3 \eta_1}{16 \sqrt{\epsilon}}\right)\left(\frac{\lambda}{2c}\right) \quad (15)$$

Thus, the gain, G, defined as the ratio of the microwave output energy to the optical input energy is:

$$G = \frac{W_{\mu w}}{W_{ph}} = \left(\frac{E_3}{4 V_{ph}}\right)\left(\frac{\lambda V_d}{2c}\right)(Y \epsilon_f) \quad (16)$$

or $$G = \left(\frac{E_3}{4V_{ph}}\right)\left(\frac{TVd}{2}\right)(Y\epsilon_f) \qquad (17)$$

Thus $$G = \left(\frac{E_3 l_2}{4V_{ph}}\right)\left(\frac{TVd}{2l_2}\right)(Y\epsilon_f) \qquad (18)$$

where: $\frac{E_3 l_2}{4V_{ph}} \qquad \frac{V_{Load}}{V_{ph}}$ the long term gain This gain equation terms that take into account the inefficiencies of the optical systems. By employing the analysis above, it is now possible to design a practical and efficient microwave source for maximum power output within the electric field and current density constraints imposed by the switch.

As will be understood from the above and as alluded to above, the switch 14 is of approximately the same width W as the width of the line (e.g., reference numeral 16) in which it is placed. The switch, when open, should be capable of holding a voltage corresponding to the average electric field $E_3$ where $E_3 = V_3/l_2$. Furthermore, when closed, the switch should be capable of carrying a current i corresponding to a maximum current density $J = i/Wd_3$, where i is the current in the transmission line, W, the width of the switch, and $d_3$ the thickness of the switch. $E_3$ and J correspond to the natural physical limits of a chosen switch. In the present invention it is recognized that for any chosen microwave frequency (or corresponding pulse length T), the transmission line segment length $l_1$ is predetermined. Furthermore, it is recognized that while the larger height of the switch, $d_3$, the more current, and thus the power, the switch can handle, the dimension $d_3$ is limited by both inductance considerations (the rise time has to be smaller than the pulse length) and in the case of light activated switches, by the penetration rate of laser light and by diffusion, whichever comes first. One aspect of the present invention relates to optimizing the transmission line spacing, $d_1$, which allows the switch to operate at both its blocking electric field when open and conducting its maximum current density when closed, thereby providing the maximum possible power with the minimum sacrifice in switching speed. This is a special condition where the natural limits of the switch determine the transmission line parameters. Thus, in the embodiment of FIG. 2, the corresponding spacing $d_2$ for LASS switches is in the mil regime with the corresponding impedances far below those of the conventional switching arrangements, i.e., about 50 ohms. As alluded to above, after appreciating the foregoing, it will become apparent to the artisan that a similar analysis can be applied to any transmission line and switch geometry, e.g., coaxial, folded, radial, etc., within the spirit and scope of the present invention.

Alternate Microwave Source Embodiments

Figure 3:
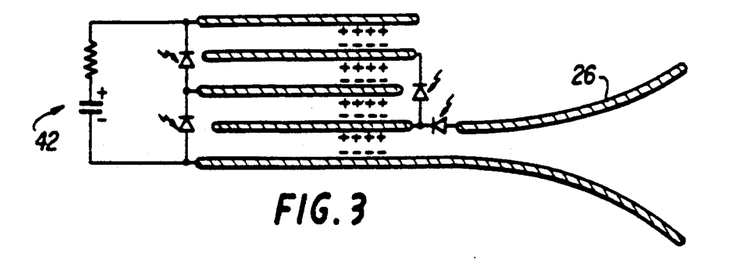
FIG. 3 is a sectional view of a microwave source comprising stacked or folded cascaded transmission lines and a transmission line charging circuit.

FIGS. 3 through 7 illustrate more compact versions of a LASS microwave source based on the concepts described above. In FIG. 3 a microwave source similar to that of FIG. 1A is, in effect, "folded" to form a multi-element capacitor. The transmission line pairs are charged by a charging circuit 42. In the example illustrated four transmission lines are connected in cascade to each other and to the antenna 26. As can be appreciated by the charge accumulation notation in FIG. 3, the required alternate charging is achieved by the displacement current as the top and bottom plates are charged to a potential difference of nV where n is the number of transmission lines and nV the potential of the charging circuit 42. This geometry obviates the need for individual charging of the transmission lines.

Figure 4:
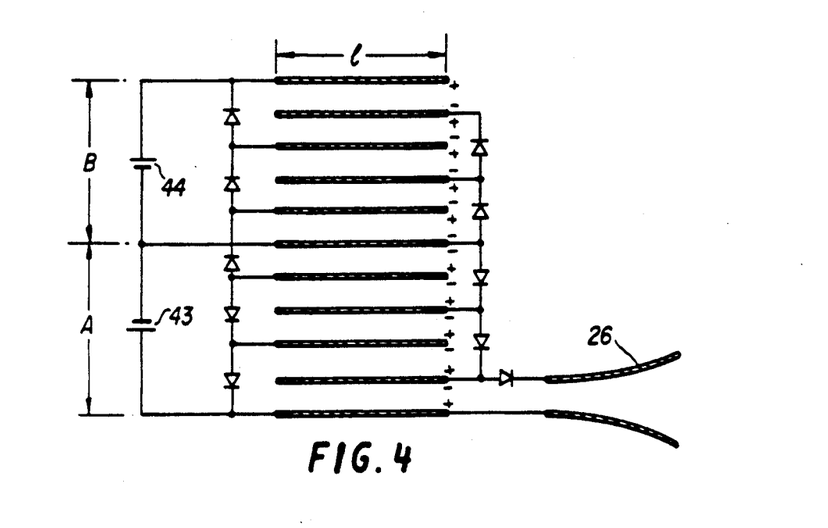
FIG. 4 is a sectional view of another embodiment of a microwave source comprising stacked or folded transmission lines and a transmission line charging circuit.

FIG. 4 is another example of a folded geometry illustrating how any number of stacked transmission line sets can be interconnected without requiring excessive charging voltages. In effect, the transmission line pairs of each "stack" are progressively charged from V to nV. The transmission line pairs of the next "stack" are charged from nV to V, where V can be either positive or negative.

In FIG. 4, the first stack of transmission lines, A, comprises five transmission line pairs, which are charged, in a manner similar to that of FIG. 3, by means of a charging circuit 43.

The second set of transmission lines, B, also comprises five transmission line pairs which are charged via a charging circuit 44.

Although the embodiment illustrated in FIG. 4 comprises stacked transmission lines of equal length, $l_1$, it should be appreciated that in this embodiment, as well as in the other embodiments described herein, the transmission line segments can be of unequal length if it is desired to modulate the resulting microwave pulses. Further, the dielectric spacing and dielectric constants can be varied to attain a particular but fixed set of voltages for the various lines in a stack. Alternatively, the individual charging voltages can be varied dynamically by the use of active elements such as transistors to charge each transmission line selectively or by using resistive voltage dividers in a manner familiar to one skilled in the art. Further, embodiments are contemplated where the transmission lines are divided by junction devices or other switches into segments smaller than $l_1$. Each segment can then be selectively connected into transmission line pairs of any desired length prior to charging or firing by selectively "closing" appropriate junction devices or switches. Alternatively, a single transmission segment can be folded in the manner illustrated.

Figure 4A:
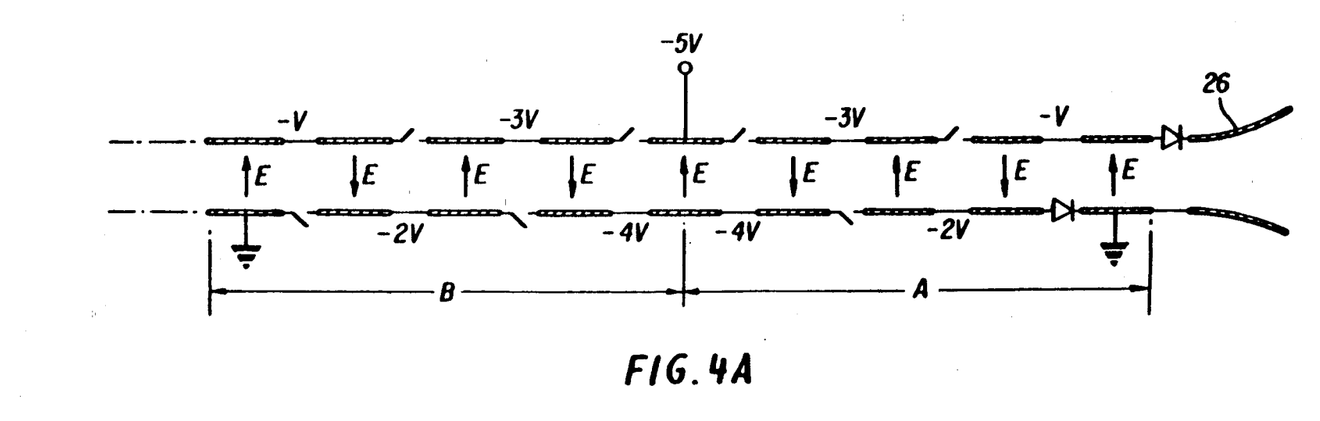
FIG. 4A is a linear representation of the folded geometry of FIG. 4.

FIG. 4A is a linear representation of the source of FIG. 4, illustrating similar, but unfolded, transmission line pair segments. Like the folded geometry of FIG. 4, the linear geometry of FIG. 4A is divided into two groups, A and B, which are connected to an antenna 26. In the example of FIG. 4A, the transmission line charge progressively varies by integers from ground potential to $-5V$ and back to potential ground. The alternating direction of the electric field E between transmission line segments is indicated by appropriate arrows.

Figure 5:
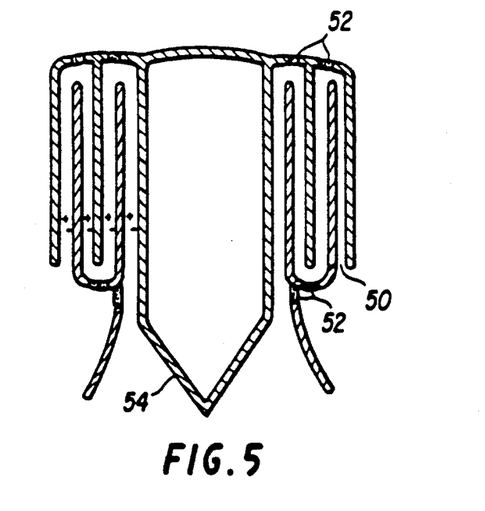
FIG. 5 is a sectional view of a compact microwave source comprising coaxial transmission lines.
Figure 6:
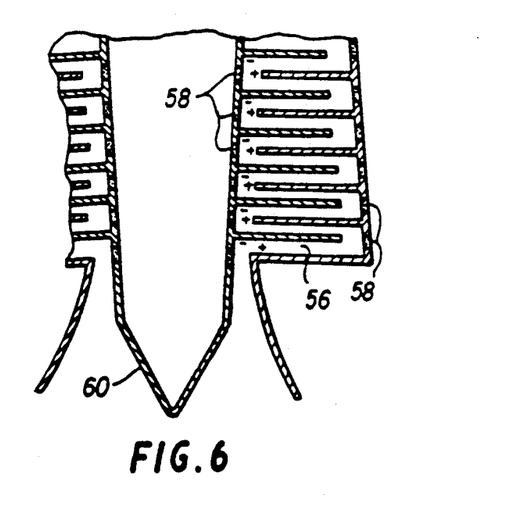
FIG. 6 is a sectional view of a compact microwave source comprising radial transmission lines.

FIGS. 5 and 6 illustrate coaxial and radial embodiments, respectively, of the same basic microwave source configuration but with increased compactness. Other compact geometrical configurations will also suggest themselves to the artisans upon examination of this description.

In FIG. 5, the transmission lines are formed as coaxial capacitors 50 separated by LASS diodes 52. In the example illustrated four transmission lines are cascaded into an antenna 54.

The radial geometry illustrated in FIG. 6 is even more compact. In this configuration, radial disc shaped transmission lines 56, switched through LASS diodes 58, are connected in cascade to a horn antenna 60. As will be apparent, a large number of such disc shaped segments can be stacked in a very compact space to permit generation of a very long train of microwave pulses.

The foregoing description of various preferred embodiments of the invention have been presented for purposes of illustration and description. They are not intended to be exhaustive or to limit the invention to the precise forms disclosed, and obviously many modifications and variations are possible in light of the above teachings. The embodiments described were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. In combination, a semiconductor switch and a transmission line, said transmission line comprising a pair of conductors separated by a distance $d_1$, and said switch being disposed adjacent a segment of one of said conductors and separated from said other conductor by a distance $d_2$, wherein the distances $d_1$ and $d_2$ are related as follows:

$$d_1, d_2 \propto \left[ \frac{\lambda E_3 \eta_1}{8JZ\sqrt{\epsilon}\,(A\eta_2 + \eta_2^2)} \right]^{\frac{1}{2}}$$

where:
J = switch current density;
$\eta_1 = l_2/l_1$ with $l_1$ being the length of a transmission line segment and $l_2$ the length of the switch associated with said transmission line segment;
$\eta_{2l} = d_3/d_2$ where $d_3$ is the thickness of the switch;
$\lambda$ = wavelength of microwaves being generated in free space;
$\epsilon$ = dielectric constant of space between transmission line conductors;
wave impedance of the transmission line;
A = scalar in the range of from about 1.0 to 10.0;
$E_3$ = electric field in the switch.

2. The combination of claim 1 wherein said semiconductor switch is a light activated switch.

3. The combination of claim 2 wherein said switch comprises a non-intrinsic junction device, switchable by means of laser light between a conducting and nonconducting state.

4. The combination of claim 3, wherein said switch is made of a silicon based material.

5. The combination of claim 1 wherein said switch comprises a light activated, reverse biased diode.

6. The combination of claim 3 wherein said switch comprises a single junction device.

7. The combination of claim 5 wherein said switch comprises a single junction device.

8. The combination of claim 3 wherein said switch comprises a multijunction device.

9. The combination of claim 5 wherein said switch comprises a multijunction device.

10. A source for generating microwaves to a load comprising a TEM transmission line and a light activated semiconductor switch for connecting said transmission line to said load, said transmission line comprising a pair of conductors, said switch being disposed between one of said conductors and said load, wherein said switch comprises a non-intrinsic function device switchable by means of laser light between a conducting and non-conducting state and made of a silicon semiconductor material whereby said junction device may be rapidly switched between said conducting and nonconducting states using said laser light, and wherein said switch and transmission line are impedance matched to generally optimize the sustainable current density and electric field in the switch with the current load and electric field of the transmission line.

11. The source of claim 10 wherein said switch further comprises a single junction normally reverse biased diode.

12. The source of claim 10 wherein said switch comprises a multijunction semiconductor device.

13. The source of claim 10 wherein said switch has a length $l_2$, and said one of the conductors has a length $l_1$, and wherein the ratio $l_2 l_1$ is in the range of on the order of 0.01 to 0.50, and wherein the effective current carrying width of said switch (W) and conductor are essentially equal.

14. The source of claim 10 wherein said conductors are separated by a distance $d_1$, and said switch has a thickness $d_3$, and wherein the ratio $d_1/d_3$ is in the range of on the order of 1.0 to 10.0 and the effective current carrying width of said switch (w) and conductor are essentially equal.

15. The source of claim 10 wherein said transmission line comprises opposing radial plates.

16. The source of claim 10 wherein said transmission line comprises folded opposing conductors.

17. The source of claim 10 wherein said transmission line comprises coaxially opposing conductors.

18. A source for generating a pulse microwave energy to a load, comprising:
a TEM transmission line;
a light activated, non-intrinsic, junction type switch for connecting said transmission line to said load; and
a means for controlling the state of said switch to discharge said transmission line through said load.

19. The source of claim 18 wherein said transmission line is impedance matched to said load.

20. The source of claim 19 wherein said load comprises an adiabatic transformer.

21. The source of claim 18 wherein the length of said TEM transmission line is equal to $\lambda/4$, where $\lambda$ is the center wavelength of the microwave pulse being generated.

22. The source of claim 18 wherein said switch comprises a silicon material.

23. The source of claim 18 wherein said switch comprises a single junction semiconductor mat(R)rial.

24. The source of claim 18 wherein said switch comprises a multijunction semiconductor material.

25. The source of claim 18 wherein said switch comprises a amorphous semiconductor material.

26. The source of claim 18 wherein said switch has a length $l_2$ and the transmission line has a length switch, $l_1$, wherein the ratio of $l_2/l_1$ is in the range of the order of 0.01 to 0.50.

27. The source of claim 18 wherein the transmission line comprises a pair of conductors separated by a distance $d_1$ and said switch has a thickness $d_3$, wherein the ratio $d_1/d_3$ for a transmission line and said switch is in the range of the order of 0.01 to 100.

28. The source of claim 26 wherein the transmission line comprises a pair of conductors separated by a distance $d_1$ and said switch has a thickness $d_3$, wherein the ratio $d_1/d_3$ for a transmission line and said switch is in the range of the order of 0.01 to 100.

29. The source of claim 28 wherein the product $l_1 d_1$ is greater than ten times the product $l_2 d_3$.

30. The source of claim 27 wherein the thickness $d_3$ is on the order of the penetration depth of the laser light used for activation.

31. The source of claim 18 wherein the transmission line comprises two parallel, linear conductors for carrying an essentially constant current density along the conductors.

32. The source of claim 18 wherein said switch has a width, w, and the transmission line has a conducting region with a width, $w_1$, wherein the ratio $w/w_1$ is in the range of the order of 0.5 to 2.

33. The source of claim 18 wherein said transmission line is in the form of coaxially disposed conducting members.

34. The source of claim 18 wherein said transmission line is formed of a disk-like member extending radially from a central axis.

35. The source of claim 18 wherein said transmission line has a wave impedance of $$d_1 \sqrt{\frac{\mu}{\epsilon}}$$

where $d_1$ is the separation between the transmission line conductors, $\mu$ is a permeability constant of the space between the transmission line conductors, and $\epsilon$ is the dielectric constant of the space between the transmission line conductors and where $d_1$ is in the range of from 0.001 in. to 0.100 in..

36. A source for generating energy in the microwave region to a load comprising
 a transmission line;
 a light-activated, back biased junction switch connected between said transmission and said load, said switch being operable, in its open state, to sustain a voltage corresponding to the average maximum electric field physically sustainable by the switch and, in its closed state, to sustain the maximum current density J equal to $Wd_3$ where W is the width of the switch and $d_3$ its thickness to thereby supply maximum power to the load and maximum switching speed.

37. The source of claim 36 wherein said junction switch is a single junction, two-layer device (e.g., diode).

38. The source of claim 36 wherein said junction switch is a two-junction., three layer device (e.g., transistor).

39. The source of claim 3 wherein said junction switch is a three-junction, four-layer device (e.g., SCR).

* * * * *